US006914809B2

(12) United States Patent
Hilton et al.

(10) Patent No.: US 6,914,809 B2
(45) Date of Patent: Jul. 5, 2005

(54) MEMORY CELL STRINGS

(75) Inventors: Richard L. Hilton, Boise, ID (US);
Corbin L. Champion, Pullman, WA (US); Kenneth K. Smith, Boise, ID (US); Frederick A. Perner, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/765,484

(22) Filed: Jan. 27, 2004

(65) Prior Publication Data

US 2005/0007833 A1 Jan. 13, 2005

Related U.S. Application Data

(63) Continuation-in-part of application No. 10/614,505, filed on Jul. 7, 2003, now Pat. No. 6,842,364.

(51) Int. Cl.[7] .............................................. G11C 11/00
(52) U.S. Cl. ..................... 365/158; 365/63; 365/189.07
(58) Field of Search ...................... 365/185, 63, 189.07

(56) References Cited

U.S. PATENT DOCUMENTS

| 6,169,686 | B1 | 1/2001 | Brug et al. |
| 6,259,644 | B1 | 7/2001 | Tran et al. |
| 6,567,297 | B2 | 5/2003 | Baker |
| 6,850,431 | B2 * | 2/2005 | Swanson et al. ............ 365/158 |
| 2002/0101758 | A1 | 8/2002 | Baker |
| 2003/0039162 | A1 | 2/2003 | Baker |

OTHER PUBLICATIONS

"Nonvolatile RAM based on Magnetic Tunnel Junction Elements" by M. Durlam et al. 2000 IEEE International Solid–State Circuits Conference 07803–5853–8/00, Motorola Labs, Physical Sciences Research Labs, Tempe, AZ, Section TA 7.3.
"A 10ns Read and Write Non–volatile Memory Array Using a Magnetic Tunnel Junction and FET Switch in each Cell" by Roy Scheuerlein et al. 2000 IEEE International Solid-–State Circuits Conference 07803–5853–8/00, IBM Research Almaden Research Center, San Jose, CA, Section TA 7.2.
"Offset Compensating Bit–Line Sensing Scheme for High Density DRAM's" by Yohi Watanabe et al., IEE Jurnal of Solid–State Circuits, vol. 29, No. 1, Jan. 1994.

* cited by examiner

*Primary Examiner*—Son T. Dinh

(57) ABSTRACT

A method for performing a read operation from a magnetic random access memory (MRAM) cell in a memory cell string is provided. The method includes applying a constant current through the memory cell string, measuring a first voltage across the memory cell string, applying a write sense current across the MRAM cell, measuring a second voltage across the memory cell string, and determining whether the first voltage differs from the second voltage.

22 Claims, 10 Drawing Sheets

//MEMORY CELL STRINGS

REFERENCE TO RELATED APPLICATION

This application is a continuation-in-part of commonly assigned U.S. patent application Ser. No. 10/614,505, filed Jul. 7, 2003, now U.S. Pat. No. 6,842,364, of which priority is hereby claimed.

BACKGROUND

Magnetic Random Access Memory ("MRAM") is a non-volatile memory that may be suitable for long term data storage. MRAM devices may perform read and write operations faster than conventional long term storage devices such as hard drives. In addition, MRAM devices may be more compact and may consume less power than conventional storage devices.

A typical MRAM device may include an array of memory cells where word lines extend along rows of the memory cells and bit lines extend along columns of the memory cells. Each memory cell may be located at a cross point of a word line and a bit line.

A memory cell in an MRAM device stores a bit of information according to an orientation of a magnetization. The magnetization of a memory cell assumes one of two stable orientations at a given time. These two orientations are known as parallel and anti-parallel and represent logic level values of "0" and "1", respectively.

The magnetization orientation affects the resistance of a memory cell such as a spin dependent tunneling junction device. For instance, the resistance of a memory cell is a first value R if the magnetization orientation is parallel; the resistance of the memory cell increases to a second value (R+ΔR) if the magnetization orientation changes from parallel to anti-parallel. The magnetization orientation of a selected memory cell, and therefore the logic state of the memory cell, may be read by determining the resistance state of the selected memory cell.

One of the challenges with MRAM devices involves electrically isolating the circuits that comprise the memory cells while maintaining a sufficient level of packing density. Although additional components such as transistors may be used to increase the isolation of memory cells, an increase in the number of components typically results in a decrease in the packing density of the memory cells, i.e., the number of memory cells per a given area. A decrease in the packing density generally results in increased costs. It would be desirable to be able to increase packing densities while increasing the electrical isolation of memory cells.

SUMMARY

In one exemplary embodiment, the present disclosure provides a method of performing a read operation from a magnetic random access memory (MRAM) cell in a memory cell string. The method includes applying a constant current through the memory cell string, measuring a first voltage across the memory cell string, applying a write sense current across the MRAM cell, measuring a second voltage across the memory cell string, and determining whether the first voltage differs from the second voltage.

BRIEF DESCRIPTION OF THE DRAWINGS

Exemplary embodiments of the invention are better understood with reference to the following drawings. The elements of the drawings are not necessarily to scale relative to each other. Like reference numerals designate corresponding similar parts.

FIG. 9b is a first diagram illustrating applying a write sense current to the MRAM memory cell shown in FIG. 9a.

DETAILED DESCRIPTION

Figure 1:
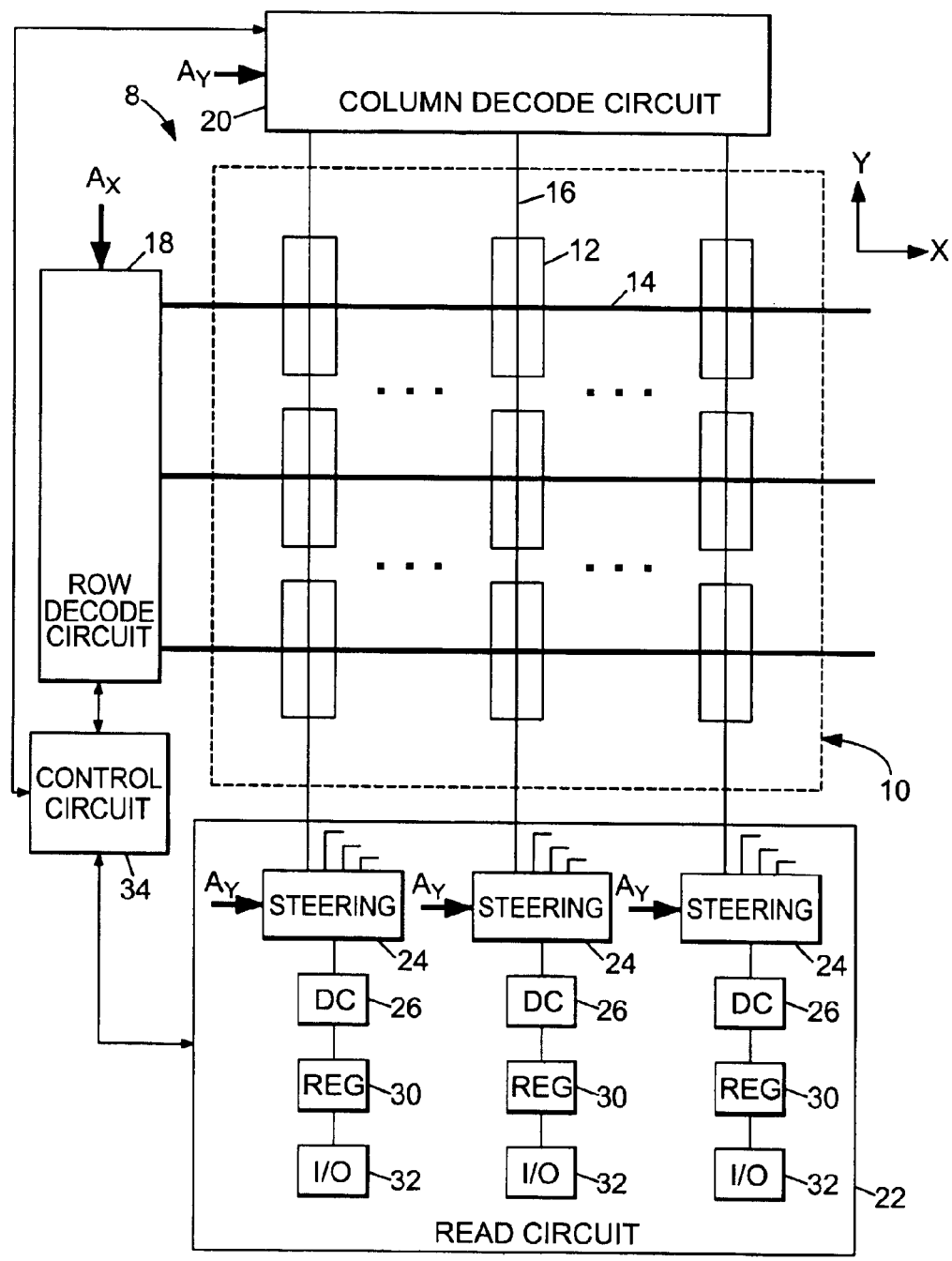
FIG. 1 is a diagram illustrating an embodiment of a data storage device that includes memory cell strings.

As shown in the drawings for purposes of illustration, the present invention is embodied in an MRAM device. In one embodiment, the MRAM device includes an array of memory cells and circuitry for reliably sensing resistance states of the memory cells. The array of memory cells is divided into memory cell strings as described herein. To read a memory cell in a memory cell string, the total resistance of the string is determined before and after the memory cell is written to a first state using either a voltage or a current measurement. If the total resistance does not change after being written to the first state, then the memory cell was in the first state prior to being written to the first state. If the total resistance changes after being written to the first state, then the memory cell was in a second state prior to being written to the first state. In this case, the memory cell is written back to the second state.

In another embodiment, an MRAM device includes an array of memory cells and circuitry for reliably sensing resistance states of the memory cells. The array of memory cells is divided into memory cell strings as described herein. To read a memory cell in a memory cell string, the total resistance of the string is determined before and after a write sense current is applied across the memory cell using either a voltage or a current measurement. If the total resistance does not change after the write sense current is applied, then the memory cell is in a first state. If the total resistance changes after the write sense current is applied, then the memory cell is in a second state.

Figure 3:
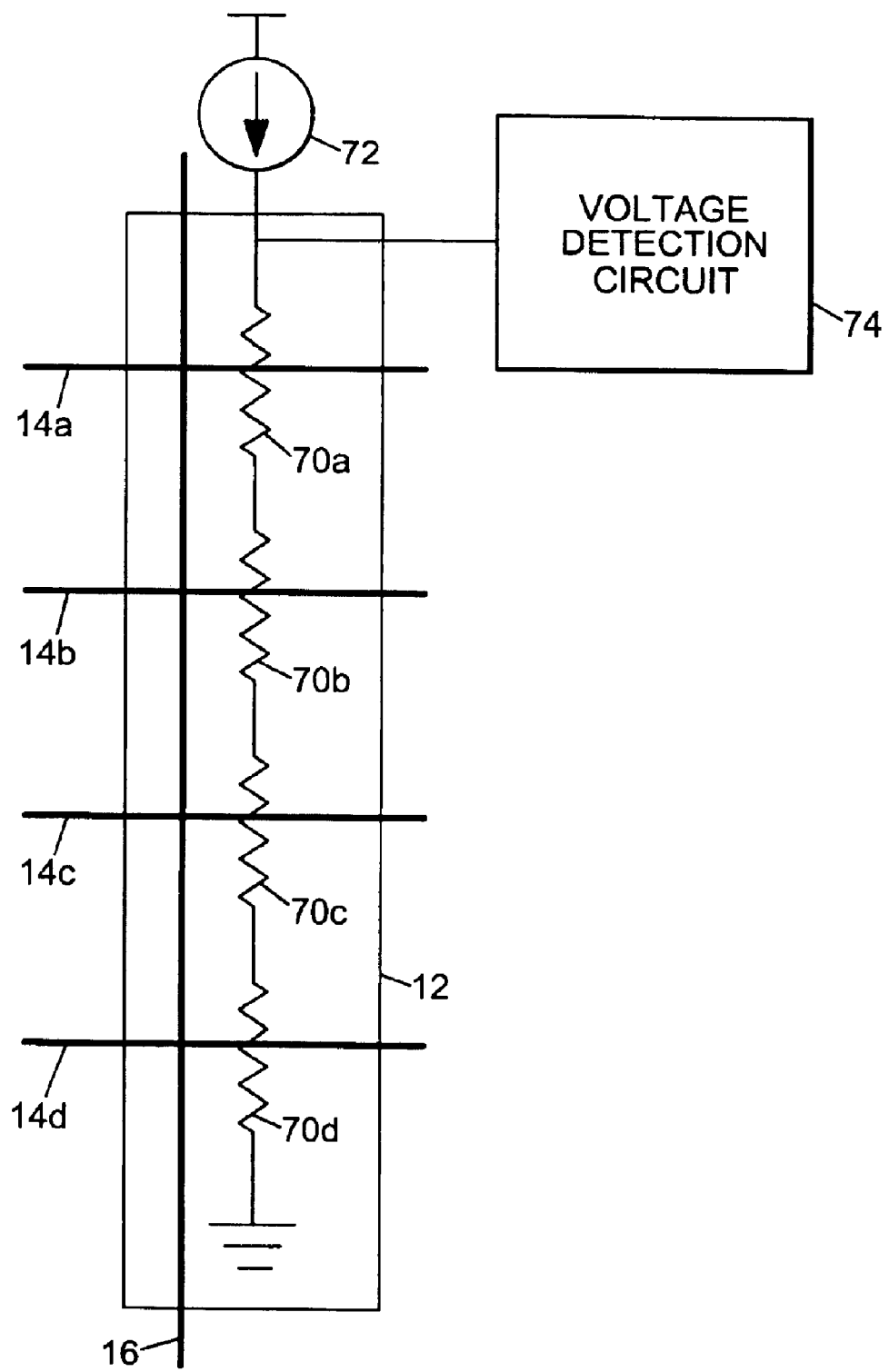
FIG. 3 is a diagram illustrating an embodiment of a first memory cell string.
Figure 5:
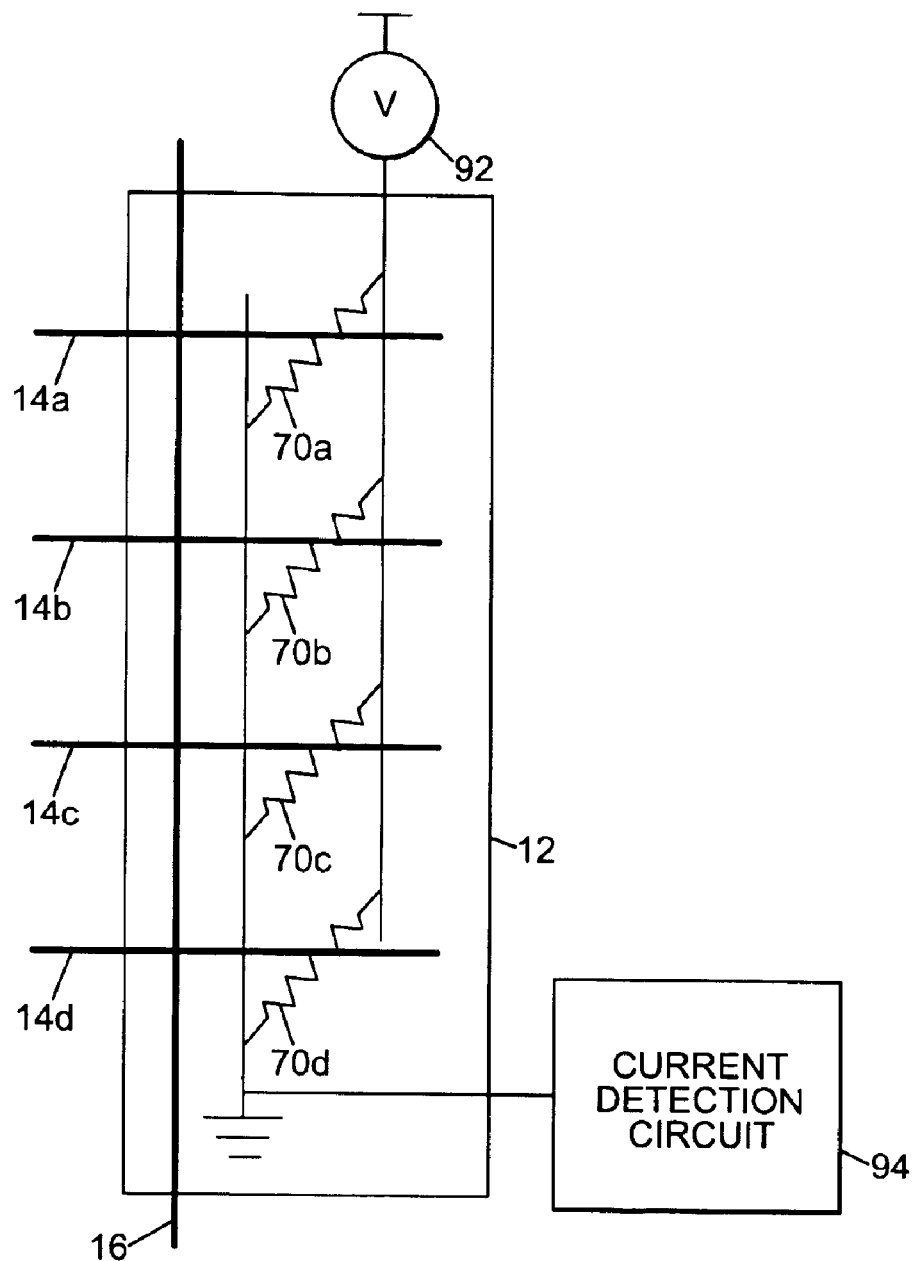
FIG. 5 is a diagram illustrating an embodiment of a second memory cell string.

Reference is now made to FIG. 1, which illustrates an embodiment of an MRAM device 8 including an array 10 of memory cell strings 12. Each memory cell string includes a plurality of memory cells as shown in the embodiments of FIGS. 3 and 5. The memory cell strings 12 are arranged in rows and columns, with the rows extending along an x-direction and the columns extending along a y-direction. Only a relatively small number of memory cell strings 12 are shown to simplify the description of the invention. In practice, arrays of any size may be used with any number of memory cell strings. The memory cell strings may each include any number of memory cells greater than or equal to two.

Traces functioning as word lines 14 extend along the x-direction in a plane on one side of the memory cell array 10. The word lines 14 shown in FIG. 1 represent one word line for each memory cell in memory cell strings 12. Traces functioning as bit lines 16 extend along the y-direction in a plane on an opposite side of the memory cell array 10. Each memory cell in memory cell strings 12 is located at a cross point of a corresponding word line 14 and bit line 16.

The memory cells are not limited to any particular type of device. For example the memory cells may be spin dependent tunneling ("SDT") junction devices.

Figure 2A:
FIG. 2a is a diagram illustrating an embodiment of a parallel magnetization orientation of an MRAM memory cell.
Figure 2B:
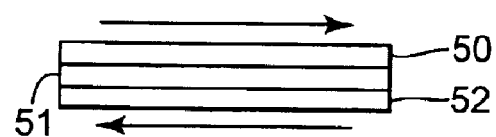
FIG. 2b is a diagram illustrating an embodiment of an anti-parallel magnetization orientation of an MRAM memory cell.

Referring now to FIGS. 2a and 2b, an SDT junction device includes a pinned layer 52. The free and pinned layers 50 and 52 are separated by an insulating tunnel barrier 51. The insulating tunnel barrier 51 allows quantum mechanical tunneling to occur between the free and pinned layers 50 and 52. This tunneling phenomenon is electron spin dependent, making the resistance of the SDT junction device a function of the relative orientations of the magnetization of the free and pinned layers 50 and 52. For instance, resistance of the SDT junction device is a first value R if the orientation of magnetization of the free and pinned layers 50 and 52 is parallel and a second value (R+ΔR) if the orientation of magnetization is anti-parallel.

Returning to FIG. 1, the MRAM device 8 also includes a row decode circuit 18. During write operations, the row decode circuit 18 applies a write current to a selected word line 14 to cause a memory cell to be written to a desired state. During read operations, the row decode circuit 18 applies a write current to a selected word line 14 to cause a memory cell to be written to a known state and may apply a write current to the selected word line 14 to cause the memory cell to be written to a previous state according to one embodiment. In another embodiment described below with respect to FIGS. 9a through 9d, 10, and 11, the row decode circuit 18 applies a write sense current to a selected word line 14 to cause a reference layer of a memory cell to be set to a known state during read operations.

The MRAM device 8 further includes a column decode circuit 20. During write operations, the column decode circuit 20 applies a write current to selected bit lines 16. During read operations, column decode circuit 20 selects a memory cell string 12 and connects the memory cell string 12 to detection circuit 26 using steering circuit 24. In the embodiment described below with respect to FIGS. 9a through 9d, 10, and 11, the column decode circuit 20 may also apply a write sense current to the selected bit lines 16 during read operations.

The MRAM device 8 further includes a read circuit 22 for sensing the resistance of selected memory cells during read operations and a write circuit (not shown) for orienting the magnetization of selected memory cells during write operations.

The read circuit 22 includes a plurality of steering circuits 24 and detection circuits 26. Multiple bit lines 16 are connected to each steering circuit 24. Each steering circuit 24 includes a set of switches that connects a write current supply to a selected bit line 16 and connects a selected memory cell string 12 to a detection circuit 26. An output of the detection circuit 26 is supplied to a data register 30, which, in turn, is coupled to an I/O pad 32 of the MRAM device 8. If the MRAM device 8 has multiple levels of memory cell arrays (see, for example, FIG. 7), bit lines 16 and memory cell strings 12 from the additional levels may be multiplexed into the detection circuits 26.

Control circuit 34 provides control signals such as timing signals to row decode circuit 18, column decode circuit 20, and read circuit 22.

FIG. 3 illustrates an embodiment of memory cell string 12. Memory cell string 12 includes memory cells 70a, 70b, 70c, and 70d, as represented by resistors, coupled in series. Word lines 14a, 14b, 14c, and 14d are used to write memory cells 70a, 70b, 70c, and 70d, respectively, in conjunction with bit line 16.

A current source 72 is coupled to one end of memory cell string 12 and the other end of memory cell string 12 is coupled to a ground source. Current source 72 is configured to provide a constant current to memory cell string 12. Current source 72 provides the constant current to memory cell string 12 in response to control signals received from row decode circuit 18, column decode circuit 20, and/or control circuit 34. In particular, current source 72 provides current to the memory cell string 12 in response to a read operation to allow one or more of memory cells 70a, 70b, 70c, and/or 70d to be read.

A voltage detection circuit 74 is coupled to memory cell string 12 between current source 72 and memory cell 70a. The voltage detection circuit 74 is configured to measure the voltage across memory cell string 12 in response to the current provided by current source 72. Voltage detection circuit 74 may be included as part of detection circuit 26.

Figure 4:
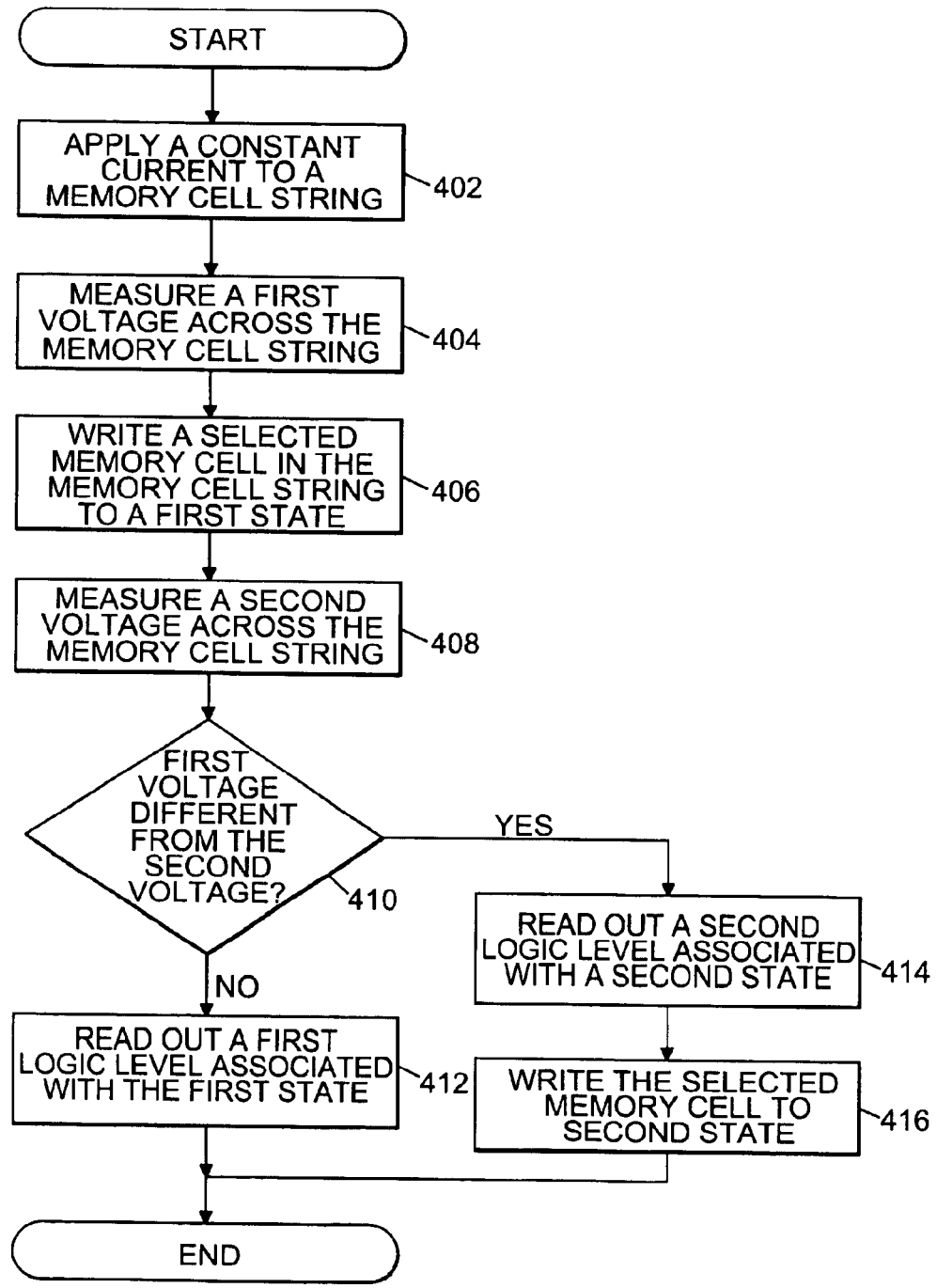
FIG. 4 is a flow chart illustrating an embodiment of a first method for reading a memory cell in a memory cell string.

FIG. 4 is a flow chart illustrating an embodiment of a method for reading a memory cell in the embodiment of memory cell string 12 shown in FIG. 3. In FIG. 4, a constant current is applied to memory cell string 12 by current source 72 as indicated in a block 402. A first voltage is measured across memory cell string 12 by voltage detection circuit 74 as indicated in a block 404.

A selected memory cell in memory cell string 12, e.g., memory cell 70b, is written to a first state as indicated in a block 406. In one embodiment, the first state may be anti-parallel to represent a logic level of "1". In other embodiments, the first state may be parallel to represent a logic level of "0".

A second voltage is measured across memory cell string 12 by voltage detection circuit 74 as indicated in a block 408. The second voltage is measured subsequent to the selected memory cell, e.g., memory cell 70b, being written to the first state.

A determination is made by detection circuit 26 as to whether the first voltage differs from the second voltage as indicated in a block 410. If the first voltage does not differ from the second voltage, then a first logic level associated with the first state is read out from the selected memory cell, e.g., memory cell 70b, as indicated in a block 412. If the first voltage differs from the second voltage, then a second logic level associated with a second state is read out from the selected memory cell, e.g., memory cell 70b, as indicated in a block 414. In addition, the selected memory cell, e.g., memory cell 70b, is written to the second state as indicated in a block 416.

Detection circuit 26 causes the first or second state to be read out from the selected memory cell by causing a "1" or a "0" to be stored in register 30 and to be provided to I/O pad 32.

As noted above, the parallel state and the anti-parallel state cause different resistances to be measured across a memory cell. Because memory cell string 12 is supplied with a constant current source, the total resistance across memory cell string 12, i.e., the sum of the resistances of the memory cells 70a, 70b, 70c, and 70d, can be deduced by measuring the voltage across the string. After measuring a first voltage in block 404, the state of a selected memory cell is determined by writing the memory cell to a known state, e.g., anti-parallel, and determining whether the voltage across memory cell string 12 changed. If the voltage has changed when the second voltage measurement is taken in block 408, then the selected memory cell was in a state that was different than the known state, e.g., parallel, prior to being written to the known state. If the voltage has not changed when the second voltage measurement is taken in block 408, then the selected memory cell was in the known state, e.g., anti-parallel, prior to being written to the known state in block 406. In other words, if the voltage did not change in response to the write, then the state of the selected memory cell did not change either.

If the write in block 406 caused the state of the selected memory cell to change, then the memory cell is re-written to its original state as illustrated by block 416. If the write in block 406 did not cause the state of the selected memory cell to change, then the memory cell remains in its original state and may not need to be re-written.

Voltage detection circuit 74 may detect a change in the voltage across memory cell string 12 in various ways. For example, voltage detection circuit 74 may measure and store the first voltage, measure the second voltage, and compare the second voltage to the stored first voltage. Alternatively, voltage detection circuit 74 may continuously monitor the voltage across the memory cell string 12 and detect whether a change occurs in the voltage in response to the selected memory cell being written to the known state.

Control circuit 34 provides appropriate timing signals to row decode circuit 18, write decode circuit 20, read circuit 22, detection circuit 26, and voltage detection circuit 74 to allow the functions of the method shown in FIG. 4 to be performed.

Any one of the memory cells 70a, 70b, 70c, and 70d may be read using the method just described. Although four memory cells are shown in the memory cell string illustrated in FIG. 3, other memory cell strings may include other numbers of memory cells coupled in series.

FIG. 5 illustrates another embodiment of memory cell string 12. Memory cell string 12 includes memory cells 70a, 70b, 70c, and 70d, as represented by resistors, coupled in parallel. Word lines 14a, 14b, 14c, and 14d are used to write memory cells 70a, 70b, 70c, and 70d, respectively, in conjunction with bit line 16.

A voltage source 92 is coupled to one end of each memory cell 70a, 70b, 70c, and 70d, and the other end of each memory cell 70a, 70b, 70c, and 70d is coupled to a ground source. Voltage source 92 is configured to provide a constant voltage to memory cell string 12. Voltage source 92 provides the constant voltage to memory cell string 12 in response to control signals received from row decode circuit 18, column decode circuit 20, and/or control circuit 34. In particular, voltage source 92 provides voltage to the memory cell string 12 in response to a read operation to allow one or more of memory cells 70a, 70b, 70c, and/or 70d to be read.

A current detection circuit 94 is coupled to memory cell string 12 between the ends of memory cells 70a, 70b, 70c, and 70d and the ground source. The current detection circuit 94 is configured to measure the current through memory cell string 12 in response to the voltage provided by voltage source 92. Current detection circuit 94 may be included as part of detection circuit 26.

Figure 6:
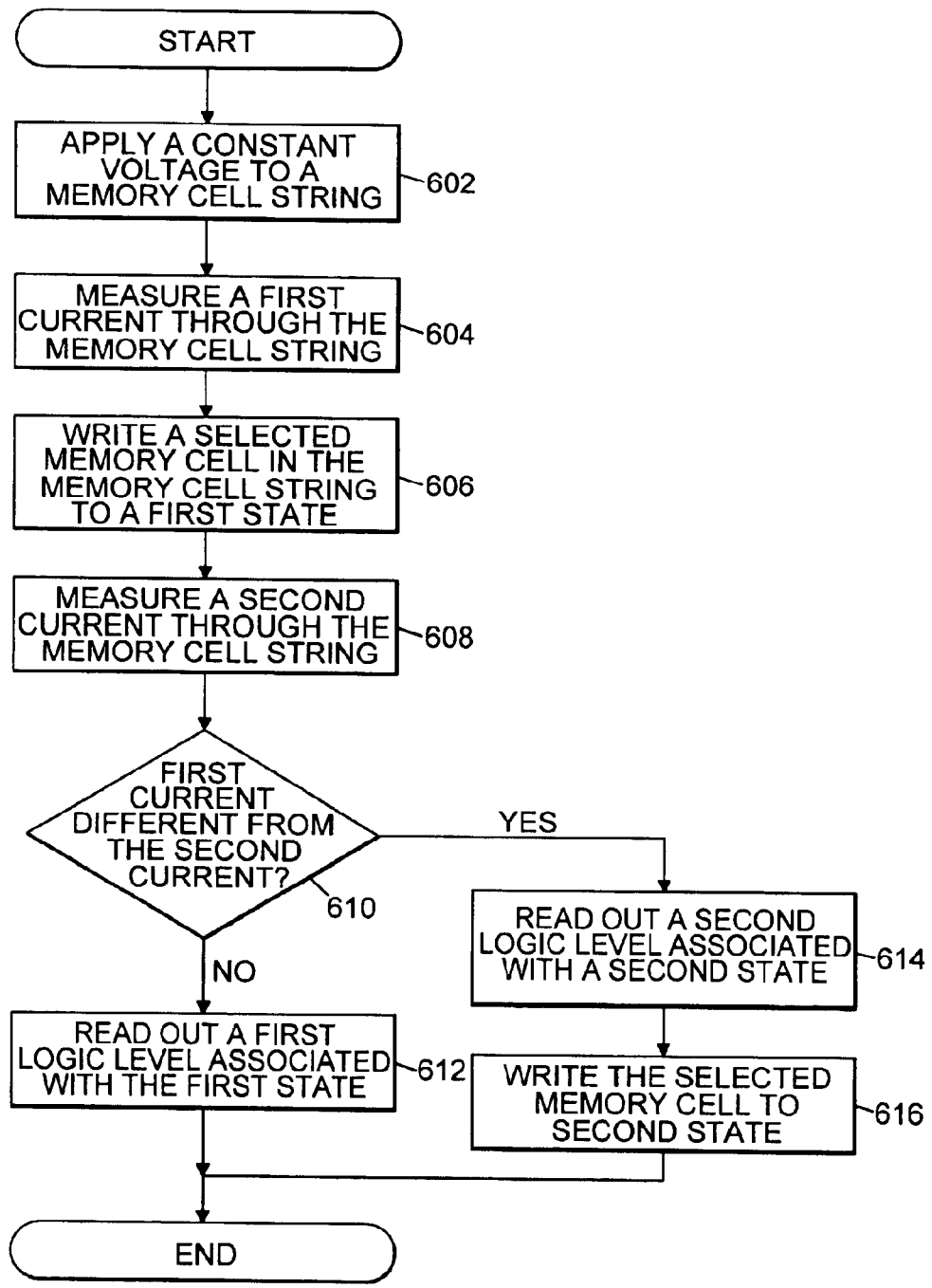
FIG. 6 is a flow chart illustrating an embodiment of a second method for reading a memory cell in a memory cell string.

FIG. 6 is a flow chart illustrating an embodiment of a method for reading a memory cell in the embodiment of memory cell string 12 shown in FIG. 5. In FIG. 6, a constant voltage is applied to memory cell string 12 by voltage source 92 as indicated in a block 602. A first current is measured through memory cell string 12 by current detection circuit 94 as indicated in a block 604.

A selected memory cell in memory cell string 12, e.g., memory cell 70c, is written to a first state as indicated in a block 606. As with the method described above in FIG. 4, the first state may be anti-parallel to represent a logic level of "1" in one embodiment and may be parallel to represent a logic level of "0" in other embodiments.

A second current is measured through memory cell string 12 by current detection circuit 94 as indicated in a block 608. The second current is measured subsequent to the selected memory cell, e.g., memory cell 70c, being written to the first state.

A determination is made by detection circuit 26 as to whether the first current differs from the second current as indicated in a block 610. If the first current does not differ from the second current, then a first logic level associated with the first state is read out from the selected memory cell, e.g., memory cell 70c, as indicated in a block 612. If the first current differs from the current voltage, then a second logic level associated with a second state is read out from the selected memory cell, e.g., memory cell 70c, as indicated in a block 614. In addition, the selected memory cell, e.g., memory cell 70c, is written to the second state as indicated in a block 616.

Detection circuit 26 causes the first or second state to be read out from the selected memory cell by causing a "1" or a "0" to be stored in register 30 and to be provided to I/O pad 32.

Because memory cell string 12 is supplied with a constant voltage source in the embodiment of FIG. 5, the total resistance across memory cell string 12 can be deduced by measuring the current through memory cell string 12. After measuring a first current in block 604, the state of a selected memory cell is determined by writing the memory cell to a known state, e.g., anti-parallel, and detecting whether the current through memory cell string 12 changed. If the current has changed when the second current measurement is taken in block 608, then the selected memory cell was in a state that was different than the known state, e.g., parallel, prior to being written to the known state. If the current has not changed when the second current measurement is taken in block 608, then the selected memory cell was in the known state, e.g., anti-parallel, prior to being written to the known state in block 606. In other words, if the current did not change in response to the write, then the state of the selected memory cell did not change either.

If the write in block 606 caused the state of the selected memory cell to change, then the memory cell is re-written to its original state as illustrated by block 616. If the write in block 606 did not cause the state of the selected memory cell to change, then the memory cell remains in its original state and may not need to be re-written.

Current detection circuit 94 may detect a change in the current through memory cell string 12 in various ways. For example, current detection circuit 94 may measure and store the first current, measure the second current, and compare the second current to the stored first current. Alternatively, current detection circuit 94 may continuously monitor the current through the memory cell string 12 and detect whether a change occurs in the current in response to the selected memory cell being written to the known state.

Control circuit 34 provides appropriate timing signals to row decode circuit 18, write decode circuit 20, read circuit 22, detection circuit 26, and current detection circuit 94 to allow the functions of the method shown in FIG. 6 to be performed.

Any one of the memory cells 70a, 70b, 70c, and 70d may be read using the method described with reference to FIG. 6. Although four memory cells are shown in the memory cell string illustrated in FIG. 5, other memory cell strings may include other numbers of memory cells coupled in parallel.

Figure 7:
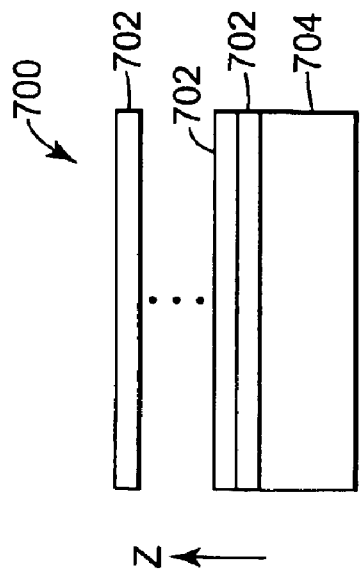
FIG. 7 is a diagram illustrating an embodiment of an MRAM device that includes multiple levels.

Reference is now made to FIG. 7 which illustrates an embodiment of a multi-level MRAM chip 700. MRAM chip 700 includes a number Z of memory cell levels or planes 702 that are stacked in a z-direction on a substrate 704. The number Z is a positive integer where Z>1. Memory cell levels 702 may be separated by insulating material (not shown) such as silicon dioxide. Read and write circuits may be fabricated on substrate 704. The read and write circuits may include additional multiplexers for selecting the levels that are read from and written to.

Figure 8:
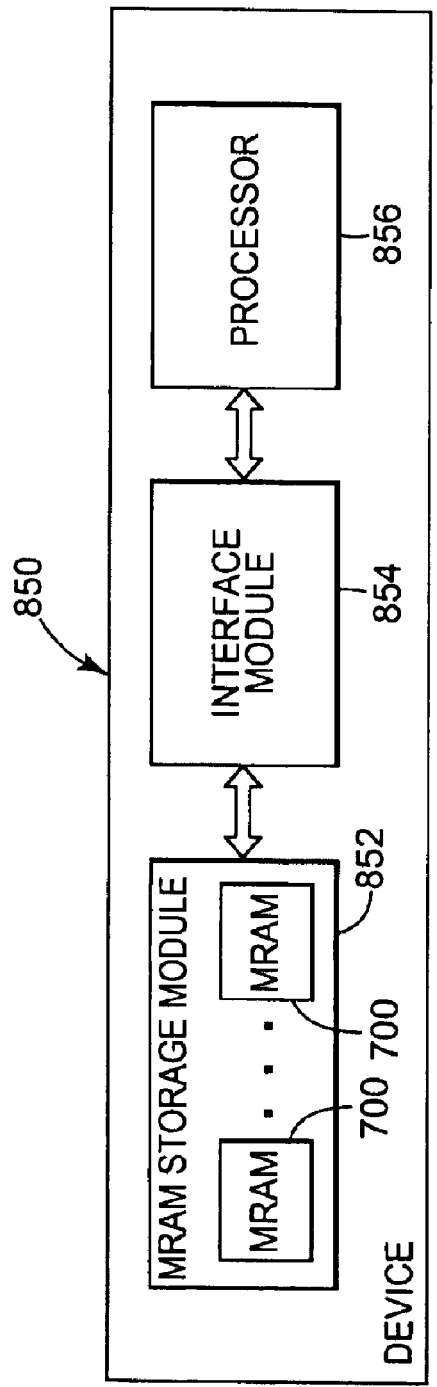
FIG. 8 is a diagram illustrating an embodiment of a system that includes one or more MRAM devices.

Thus, disclosed is an MRAM device in which resistance states of memory cells can be sensed during read operations. The MRAM device described herein may be used in a variety of applications. FIG. 8 shows an exemplary general application for one or more MRAM chips 700. The general application is embodied by a device 850 including a MRAM storage module 852, an interface module 854 and a processor 856. MRAM storage module 852 includes one or more MRAM chips 700 for non-volatile storage. Interface module 854 provides an interface between processor 856 and MRAM storage module 852. Device 850 could also include other types and/or levels of memory.

For a device 850 such as a notebook computer or personal computer, MRAM storage module 852 might include a number of MRAM chips 700 and interface module 854 might include an IDE or SCSI interface. For a device 850 such as a server, MRAM storage module 852 might include a greater number of MRAM chips 700, and interface module 854 might include a fiber channel or SCSI interface. Such MRAM storage modules 852 could replace or supplement conventional non-volatile storage devices such as hard drives.

For a device 850 such as a digital camera, MRAM storage module 852 might include a smaller number of MRAM chips 700 and interface module 854 might include a camera interface. Such a MRAM storage module 852 would allow non-volatile storage of digital images on-board the digital camera.

FIGS. 9a through 9d are diagrams illustrating an embodiment of an MRAM memory cell with a soft reference layer 902. The MRAM memory cell shown in FIGS. 9a through 9d is a SDT junction device that includes a data layer 900 and a soft reference layer 902 separated by an insulating tunnel barrier 901. The insulating tunnel barrier 901 allows quantum mechanical tunneling to occur between the data layer 900 and the soft reference layer 902. This tunneling phenomenon is electron spin dependent, making the resistance of the SDT junction device a function of the relative orientations of the magnetization of the data layer 900 and the soft reference layer 902. For instance, resistance of the SDT junction device is a first value R if the orientation of magnetization of the data layer 900 and the soft reference layer 902 is parallel and a second value (R+ΔR) if the orientation of magnetization is anti-parallel.

The data layer 900 and the soft reference layer 902 both comprise free layers similar to free layer 50 described above with reference to FIG. 2. Accordingly, the orientation of magnetization may be changed in both the data layer 900 and the soft reference layer 902 by applying currents on a word line 14 and a bit line 16. The memory cell of FIGS. 9a through 9d is written by applying write currents a word line 14 and a bit line 16 to set a direction of magnetization of the data layer 900 and the soft reference layer 902 to selected direction. Writing the memory cell causes the direction of magnetization in both the data layer 900 and the soft reference layer 902 to be the same. After the write current is removed, magnetic coupling from the data layer 900 to the soft reference layer 902 causes the direction of magnetization of the soft reference layer to reverse direction to be anti-parallel with respect to the data layer. Accordingly, the memory cell is initially in an anti-parallel state in response to seeking the lowest energy state.

Subsequent to being written, the memory cell may be read by applying a write sense current to set the soft reference layer 902 to a known direction of magnetization using a word line 14. In certain embodiments, a write sense current may be applied on bit line 16 along with the write sense current applied on word line 14 to set the soft reference layer 902 to the known direction of magnetization. A write sense current comprises a current with a magnitude that is sufficient to set the direction of magnetization of the soft reference layer 902 but is insufficient or below a threshold needed to set the direction of magnetization of the data layer 900. In other words, a write sense current may change the state of the soft reference layer 902 but a write sense current does not change the state of the data layer 900. After the soft reference layer has been set to the known direction of magnetization, the memory cell may be in either a parallel or an anti-parallel state.

Figure 9A:
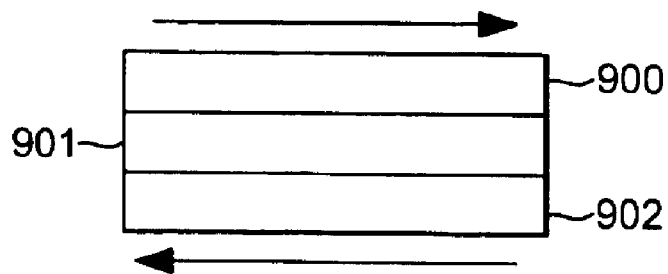
FIG. 9a is a diagram illustrating an embodiment of an MRAM memory cell in a first state.

FIG. 9a illustrates the memory cell after it has been written to a first state. The arrows above and below the memory cell indicate the direction of magnetization of the data layer 900 and the soft reference layer 902, respectively. The first state is defined by the direction of magnetization of the data layer 900 which is shown to be in a rightward direction in FIG. 9a. As noted above, the memory cell is in an anti-parallel state in response to seeking the lowest energy state.

Figure 9B:
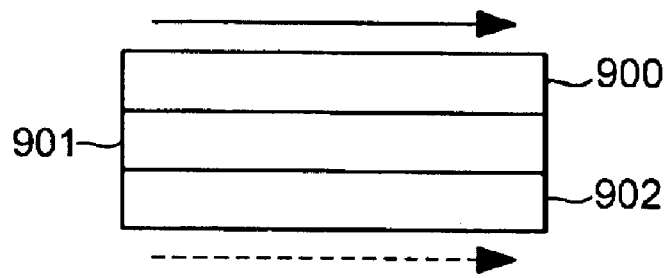

FIG. 9b illustrates reading the first state from the memory cell. A write sense current is applied across the memory cell to set the soft reference layer 902 to a known state, i.e., known direction of magnetization, as indicated by the dotted arrow, which is shown to be in a rightward direction in FIG. 9b. In FIG. 9b, the known direction of magnetization set in the soft reference layer is in the same direction as the direction of magnetization, i.e., the first state, of the data layer 900. Accordingly, the memory cell is in a parallel state in response to the write sense current being applied.

Figure 9C:
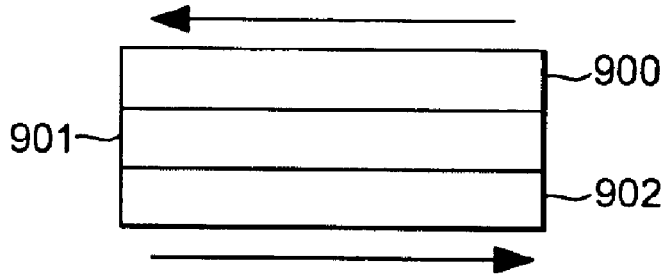
FIG. 9c is a diagram illustrating an embodiment of an MRAM memory cell in a second state.

FIG. 9c illustrates the memory cell after it has been written to a second state. The arrows above and below the memory cell indicate the direction of magnetization of the data layer 900 and the soft reference layer 902, respectively. The second state is defined by the direction of magnetization of the data layer 900 which is shown to be in a leftward direction in FIG. 9c. As noted above, the memory cell is in an anti-parallel state in response to seeking the lowest energy state.

Figure 9D:
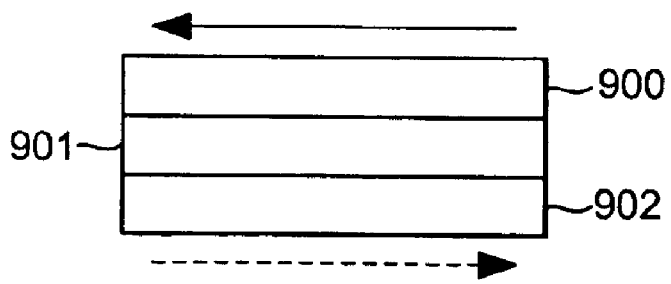
FIG. 9d is a first diagram illustrating applying a write sense current to the MRAM memory cell shown in FIG. 9c.

FIG. 9d illustrates reading the second state from the memory cell. A write sense current is applied across the memory cell to set the soft reference layer 902 to a known state, i.e., known direction of magnetization, as indicated by the dotted arrow, which is shown to be in a rightward direction in FIG. 9d as it is in FIG. 9b. In FIG. 9d, the known direction of magnetization set in the soft reference layer is in the opposite direction as the direction of magnetization, i.e., the second state, of the data layer 900. Accordingly, the memory cell is in an anti-parallel state in response to the write sense current being applied.

Figure 10:
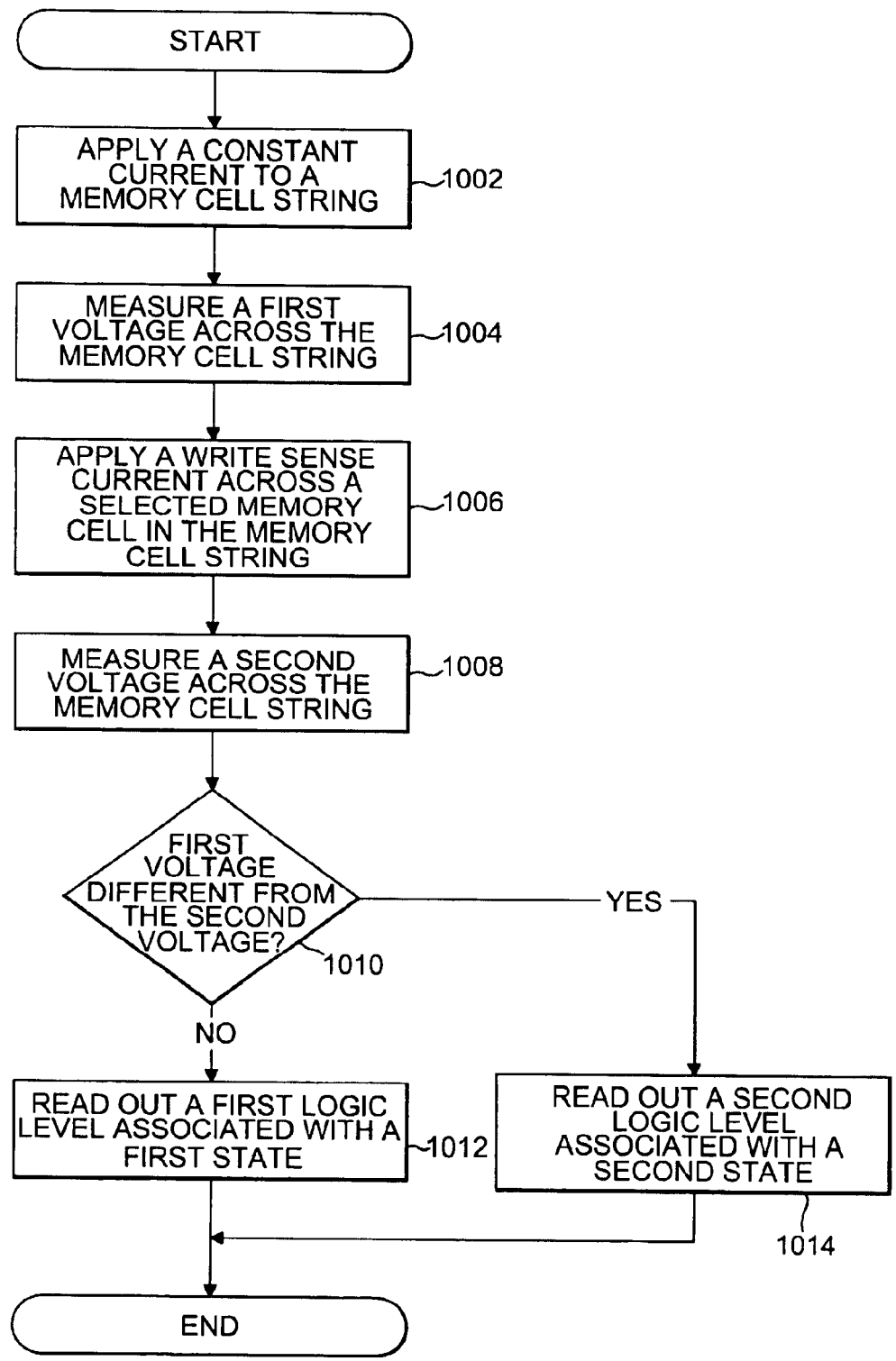
FIG. 10 is a flow chart illustrating an embodiment of a third method for reading a memory cell in a memory cell string.

FIG. 10 is a flow chart illustrating an embodiment of a method for reading a memory cell in the embodiment of memory cell string 12 shown in FIG. 3. For the embodiment of FIG. 10, memory cells 70a, 70b, 70c, and 70d each include a soft reference layer 902 as described above with reference to FIGS. 9a through 9d.

In FIG. 10, a constant current is applied to memory cell string 12 by current source 72 as indicated in a block 1002. A first voltage is measured across memory cell string 12 by voltage detection circuit 74 as indicated in a block 1004.

A write sense current is applied across a selected memory cell in memory cell string 12, e.g., memory cell 70b, as indicated in a block 1006. The write sense current comprises a current that is applied on a word line 14 across the selected memory cell, e.g., word line 14b for memory cell 70b. The write sense current is of a magnitude that is sufficient to set the soft reference layer 902 of the selected memory cell to a known state, i.e., direction of magnetization, but below a level that would cause the data layer 900 of the selected memory cell to change state, i.e., be written. In certain embodiments, the write sense current also comprises a current that is applied on a bit line 16 across the selected memory cell.

A second voltage is measured across memory cell string 12 by voltage detection circuit 74 as indicated in a block 1008. The second voltage is measured subsequent to the write sense current being applied across the selected memory cell, e.g., memory cell 70b.

A determination is made by detection circuit 26 as to whether the first voltage differs from the second voltage as indicated in a block 1010. If the first voltage does not differ from the second voltage, then a first logic level associated with a first state is read out from the selected memory cell, e.g., memory cell 70b, as indicated in a block 1012. If the first voltage differs from the second voltage, then a second logic level associated with a second state is read out from the selected memory cell, e.g., memory cell 70b, as indicated in a block 1014.

Detection circuit 26 causes the first or second state to be read out from the selected memory cell by causing a "1" or a "0" to be stored in register 30 and to be provided to I/O pad 32.

As noted above, the parallel state and the anti-parallel state cause different resistances to be measured across a memory cell. Because memory cell string 12 is supplied with a constant current source, the total resistance across memory cell string 12, i.e., the sum of the resistances of the memory cells 70a, 70b, 70c, and 70d, can be deduced by measuring the voltage across the string. In memory cells with soft reference layers 902, a memory cell is initially in a known state, i.e., the data layer 900 and the soft reference layer 902 are anti-parallel, in response to being written. Accordingly, a first voltage may be measured as described in block 1004 knowing that each memory cell in a memory cell string, including the memory cell selected for reading, is in an anti-parallel state.

After measuring the first voltage, the write sense current is applied across the selected memory cell to set the soft reference layer to a known direction of magnetization and a second voltage is measured as noted in blocks 1006 and 1008. If the voltage did not change when the second voltage measurement was taken in block 1008, then the total resistance across the memory cell string did not change. Accordingly, the direction of magnetization of the data layer 900 of the selected memory cell is in a direction that is anti-parallel to the known direction of magnetization of the soft reference layer 902 caused by the write sense current. This direction of magnetization of the data layer 900, i.e., anti-parallel to the known direction of magnetization of the soft reference layer 902, comprises a first state of the selected memory cell.

If the voltage changed when the second voltage measurement was taken in block 1008, then the total resistance across the memory cell string has changed as well. Accordingly, the direction of magnetization of the data layer 900 of the selected memory cell is in a direction that is parallel to the known direction of magnetization of the soft reference layer 902 caused by the write sense current. This direction of magnetization of the data layer 900, i.e., parallel to the known direction of magnetization of the soft reference layer 902, comprises a second state of the selected memory cell.

Because the application of the write sense current across the selected memory cell did not change the state of the data layer 900 of the selected memory cell, the selected memory cell does riot need to be re-written to its original state.

Voltage detection circuit 74 may detect a change in the voltage across memory cell string 12 in various ways. For example, voltage detection circuit 74 may measure and store the first voltage, measure the second voltage, and compare the second voltage to the stored first voltage. Alternatively, voltage detection circuit 74 may continuously monitor the voltage across the memory cell string 12 and detect whether a change occurs in the voltage in response to applying a write sense current to the selected memory cell.

Control circuit 34 provides appropriate timing signals to row decode circuit 18, write decode circuit 20, read circuit 22, detection circuit 26, and voltage detection circuit 74 to allow the functions of the method shown in FIG. 10 to be performed.

Any one of the memory cells 70a, 70b, 70c, and 70d may be read using the method just described. Although four memory cells are shown in the memory cell string illustrated in FIG. 3, other memory cell strings may include other numbers of memory cells coupled in series.

Figure 11:
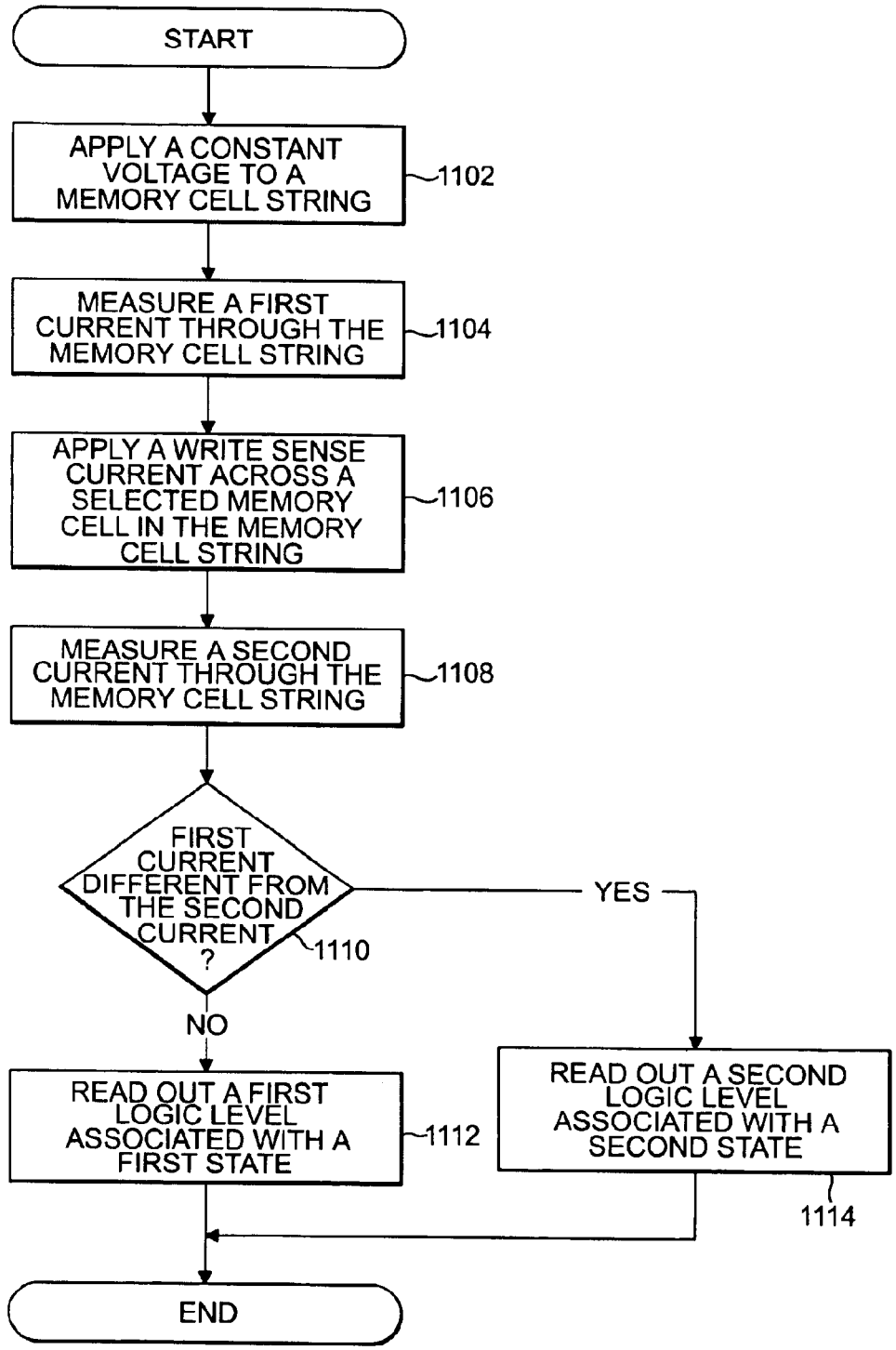
FIG. 11 is a flow chart illustrating an embodiment of a fourth method for reading a memory cell in a memory cell string.

FIG. 11 is a flow chart illustrating an embodiment of a method for reading a memory cell in the embodiment of memory cell string 12 shown in FIG. 5. For the embodiment of FIG. 11, memory cells 70a, 70b, 70c, and 70d each include a soft reference layer 902 as described above with reference to FIGS. 9a through 9d.

In FIG. 11, a constant voltage is applied to memory cell string 12 by voltage source 92 as indicated in a block 1102. A first current is measured through memory cell string 12 by current detection circuit 94 as indicated in a block 1104.

A write sense current is applied across a selected memory cell in memory cell string 12, e.g., memory cell 70b, as indicated in a block 1106. The write sense current comprises a current that is applied on a word line 14 across the selected memory cell, e.g., word line 14b for memory cell 70b. The write sense current is of a magnitude that is sufficient to set the soft reference layer 902 of the selected memory cell to a known state, i.e., direction of magnetization, but below a level that would cause the data layer 900 of the selected memory cell to change state, i.e., be written. In certain embodiments, the write sense current also comprises a current that is applied on a bit line 16 across the selected memory cell.

A second current is measured through memory cell string 12 by current detection circuit 94 as indicated in a block 1108. The second current is measured subsequent to the write sense current being applied across the selected memory cell, e.g., memory cell 70c.

A determination is made by detection circuit 26 as to whether the first current differs from the second current as indicated in a block 1110. If the first current does not differ from the second current, then a first logic level associated with a first state is read out from the selected memory cell, e.g., memory cell 70c, as indicated in a block 1112. If the first current differs from the current voltage, then a second logic level associated with a second state is read out from the selected memory cell, e.g., memory cell 70c, as indicated in a block 1114.

Detection circuit 26 causes the first or second state to be read out from the selected memory cell by causing a "1" or a "0" to be stored in register 30 and to be provided to I/O pad 32.

As noted above, the parallel state and the anti-parallel state cause different resistances to be measured across a memory cell. Because memory cell string 12 is supplied with a constant voltage source in the embodiment of FIG. 5, the total resistance across memory cell string 12, i.e., the sum of the resistances of the memory cells 70a, 70b, 70c, and 70d, can be deduced by measuring the current through the string. In memory cells with soft reference layers 902, a memory cell is initially in a known state, i.e., the data layer 900 and the soft reference layer 902 are anti-parallel, in response to being written. Accordingly, a first current may be measured as described in block 1104 knowing that each memory cell in a memory cell string, including the memory cell selected for reading, is in an anti-parallel state.

After measuring the first current, the write sense current is applied across the selected memory cell to set the soft reference layer to a known direction of magnetization and a second current is measured as noted in blocks 1106 and 1108. If the current did not change when the second current measurement was taken in block 1108, then the total resistance across the memory cell string did not change. Accordingly, the direction of magnetization of the data layer 900 of the selected memory cell is in a direction that is anti-parallel to the known direction of magnetization of the soft reference layer 902 caused by the write sense current. This direction of magnetization of the data layer 900, i.e., anti-parallel to the known direction of magnetization of the soft reference layer 902, comprises a first state of the selected memory cell.

If the current changed when the second current measurement was taken in block 1108, then the total resistance across the memory cell string has changed as well. Accordingly, the direction of magnetization of the data layer 900 of the selected memory cell is in a direction that is parallel to the known direction of magnetization of the soft reference layer 902 caused by the write sense current. This direction of magnetization of the data layer 900, i.e., parallel to the known direction of magnetization of the soft reference layer 902, comprises a second state of the selected memory cell.

Because the application of the write sense current across the selected memory cell did not change the state of the data layer 900 of the selected memory cell, the selected memory cell does not need to be re-written to its original state.

Current detection circuit 94 may detect a change in the current through memory cell string 12 in various ways. For example, current detection circuit 94 may measure and store the first current, measure the second current, and compare the second current to the stored first current. Alternatively, current detection circuit 94 may continuously monitor the current through the memory cell string 12 and detect whether a change occurs in the current in response to the selected memory cell being written to the known state.

Control circuit 34 provides appropriate timing signals to row decode circuit 18, write decode circuit 20, read circuit 22, detection circuit 26, and current detection circuit 94 to allow the functions of the method shown in FIG. 11 to be performed.

Any one of the memory cells 70a, 70b, 70c, and 70d may be read using the method described with reference to FIG. 6. Although four memory cells are shown in the memory cell string illustrated in FIG. 5, other memory cell strings may include other numbers of memory cells coupled in parallel.

The above embodiments of the MRAM device may offer advantages over other MRAM devices. For example, a higher level of memory cell densities may be achieved compared to other MRAM devices that include additional elements. Increased densities may result in decreased costs for a given amount of storage capacity. In addition, the memory cell strings described herein may provide better electrical circuit isolation compared to previous MRAM devices. The improved isolation may allow for more reliable detection of the state of memory cells in a memory cell string.

The memory device is not limited to the specific embodiments described and illustrated above. For instance, an MRAM device is not limited to the use of spin dependent tunneling devices. Other types of devices that could be used include, but are not limited to, giant magnetoresistance ("GMR") devices.

The MRAM device has been described in connection with the rows being oriented along the x-axis and columns being oriented along the y-axis. However, the rows and columns could be transposed.

The memory device is not limited to MRAM cells. The memory device may include any type of memory cell in a resistive cross point array.

What is claimed is:

1. A method of performing a read operation from a magnetic random access memory (MRAM) cell in a memory cell string comprising:
    applying a first current through the memory cell string, the first current comprising a constant current;
    measuring a first voltage across the memory cell string;
    applying a second current across the MRAM cell, the second current comprising a write sense current;
    measuring a second voltage across the memory cell string; and
    determining whether the first voltage differs from the second voltage.

2. The method of claim 1 further comprising:
determining that the MRAM cell is in a first state in response to the first voltage differing from the second voltage.

3. The method of claim 2 further comprising:
reading out a logic level associated with the first state in response to the first voltage differing from the second voltage.

4. The method of claim 2 further comprising:
determining that the MRAM cell is in a second state in response to the first voltage not differing from the second voltage.

5. The method of claim 4 further comprising:
reading out a logic level associated with the second state in response to the first voltage not differing from the second voltage.

6. The method of claim 1 further comprising:
applying the second current across the MRAM cell to set a reference layer of the memory cell to a known state.

7. A data storage device comprising:
a memory cell string that includes a first memory cell and a second memory cell coupled in series;
a current source configured to apply a first current through the string, the first current comprising a constant current; and
a circuit coupled to the memory cell string, the circuit configured to detect a change in a voltage across the memory cell string in response to the current source applying the constant current through the memory cell string and a second current being applied across the first memory cell, the second current comprising a write sense current.

8. The data storage device of claim 7 wherein the memory cell string has a first end and a second end, and wherein the current source is coupled to the first end.

9. The data storage device of claim 8 further comprising:
a ground source coupled to the second end of the memory cell string.

10. The data storage device of claim 7 wherein the circuit is configured to detect that the first memory cell was in a first state in response to detecting a change in the voltage across the memory cell string.

11. The data storage device of claim 10 wherein the circuit is configured to detect that the first memory cell was in a second state in response to not detecting a change in the voltage across the memory cell string.

12. A method of performing a read operation from a magnetic random access memory (MRAM) cell in a memory cell string comprising:
applying a constant voltage across the memory cell string;
measuring a first current through the memory cell string;
applying a second current across the MRAM cell, the second current comprising a write sense current;
measuring a third current through the memory cell string; and
determining whether the first current differs from the third current.

13. The method of claim 12 further comprising:
determining that the MRAM cell was in a first state in response to the first current not differing from the third current.

14. The method of claim 13 further comprising:
reading out a logic level associated with the first state in response to the first current not differing from the third current.

15. The method of claim 13 further comprising:
determining that the MRAM cell was in a second state in response to the first current differing from the third current.

16. The method of claim 15 further comprising:
reading out a logic level associated with the second state in response to the first current differing from the second current.

17. The method of claim 12 further comprising:
applying the second current across the MRAM cell to set a reference layer of the memory cell to a known state.

18. A data storage device comprising:
a memory cell string that includes a first memory cell and a second memory cell coupled in parallel;
a voltage source configured to apply a constant voltage across the string; and
a means for detecting a change in a first current through the memory cell string in response to the voltage source applying the constant voltage across the memory cell string and a second current being applied across the first memory cell, the second current comprising a write sense current.

19. The data storage device of claim 18 wherein the first and second memory cells each have a first end and a second end, and wherein the voltage source is coupled to the first end of each of the first and second memory cells.

20. The data storage device of claim 19 further comprising:
a ground source coupled to the second end of each of the first and second memory cells.

21. The data storage device of claim 18 wherein the means is for detecting that the first memory cell was in a first state in response to detecting a change in the first current through the memory cell string.

22. The data storage device of claim 21 wherein the means is for detecting that the first memory cell was in a second state in response to not detecting a change in the first current through the memory cell string.

* * * * *